US007235887B2

(12) United States Patent
Lee et al.

(10) Patent No.: US 7,235,887 B2
(45) Date of Patent: Jun. 26, 2007

(54) SEMICONDUCTOR PACKAGE WITH IMPROVED CHIP ATTACHMENT AND MANUFACTURING METHOD THEREOF

(75) Inventors: Jong-Ung Lee, Chungcheongnam-do (KR); Wha-Su Sin, Chungcheongnam-do (KR); Jong-Keun Jeon, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/912,861

(22) Filed: Aug. 6, 2004

(65) Prior Publication Data

US 2005/0040514 A1 Feb. 24, 2005

(30) Foreign Application Priority Data

Aug. 22, 2003 (KR) ..................... 10-2003-0058274

(51) Int. Cl.
*H01L 23/48* (2006.01)
*H01L 23/52* (2006.01)
*H01L 29/40* (2006.01)

(52) U.S. Cl. ...................... 257/783; 257/777; 257/778; 257/779; 257/780; 257/781; 257/782; 257/784; 257/E21.514

(58) Field of Classification Search ..................... None
See application file for complete search history.

(56) References Cited

U.S. PATENT DOCUMENTS 4,604,644 A * 8/1986 Beckham et al. ........... 257/737
4,760,440 A * 7/1988 Bigler et al. ................ 257/680
4,957,882 A * 9/1990 Shinomiya ................... 438/65
5,126,813 A * 6/1992 Takahashi et al. .......... 257/417
5,281,794 A * 1/1994 Uehara et al. ............. 219/243
5,296,738 A * 3/1994 Freyman et al. ............ 257/684
5,444,301 A * 8/1995 Song et al. ................. 257/737

(Continued)

FOREIGN PATENT DOCUMENTS

JP 6-144408 * 5/1994

(Continued)

OTHER PUBLICATIONS

English language abstract of Japanese Publication No. 2001-313307.

(Continued)

*Primary Examiner*—Jasmine Clark
(74) *Attorney, Agent, or Firm*—Marger Johnson & McCollom, P.C.

(57) ABSTRACT

A semiconductor package comprises a chip having a top surface for chip pads and a bottom surface opposite the top surface. The top and bottom surfaces define side surfaces. The package further includes an adhesive layer provided within a chip-attaching area substantially defined by side surfaces of the chip and attaches a chip to, for example, a substrate having substrate pads. This prevents the contamination of the substrate pads by the adhesive layer. In one embodiment, the adhesive layer has at least one hole formed therethrough to expose a portion of the bottom surface of the chip. The adhesive layer may include at least one passage laterally connecting the hole to the outside. Alternatively, the adhesive layer has a plurality of adhesive parts separately disposed on the semiconductor chip.

25 Claims, 8 Drawing Sheets

141 120 181 121 143 140 142 144 141

U.S. PATENT DOCUMENTS

| | | | | |
|---|---|---|---|---|
| 5,543,585 | A * | 8/1996 | Booth et al. | 174/261 |
| 5,834,339 | A * | 11/1998 | Distefano et al. | 438/125 |
| 5,834,835 | A * | 11/1998 | Maekawa | 257/680 |
| 5,844,320 | A * | 12/1998 | Ono et al. | 257/778 |
| 5,851,853 | A * | 12/1998 | Lee et al. | 438/108 |
| 6,188,127 | B1 * | 2/2001 | Senba et al. | 257/686 |
| 6,251,211 | B1 * | 6/2001 | Lake | 156/273.3 |
| 6,266,249 | B1 * | 7/2001 | Desai et al. | 361/760 |
| 6,340,846 | B1 | 1/2002 | LoBianco et al. | |
| 6,465,275 | B2 | 10/2002 | King et al. | |
| 6,468,448 | B1 * | 10/2002 | Amami et al. | 252/506 |
| 6,521,997 | B1 * | 2/2003 | Huang et al. | 257/737 |
| 6,528,352 | B1 * | 3/2003 | Jackson et al. | 438/118 |
| 6,593,662 | B1 * | 7/2003 | Pu et al. | 257/777 |
| 6,825,557 | B2 * | 11/2004 | DiBattista et al. | 257/712 |
| 2002/0162679 | A1 * | 11/2002 | Hannan et al. | 174/52.4 |
| 2002/0197769 | A1 | 12/2002 | Choi | |
| 2003/0038357 | A1 | 2/2003 | Derderian | |

FOREIGN PATENT DOCUMENTS

| | | |
|---|---|---|
| JP | 2001-313307 | 11/2001 |
| JP | 2002-110895 | 12/2002 |
| KR | 1020000046446 | 7/2000 |
| KR | 1020010025874 | 4/2001 |
| KR | 1020010099722 | 11/2001 |

OTHER PUBLICATIONS

English language abstract of Japanese Publication No. 2002-110895.

English language abstract of Korean Publication No. 1020010025874.

English language abstract of Korean Publication No. 1020010099722.

English language abstract of Korean Publication No. 1020000046446.

* cited by examiner

SEMICONDUCTOR PACKAGE WITH IMPROVED CHIP ATTACHMENT AND MANUFACTURING METHOD THEREOF

CROSS REFERENCE TO RELATED APPLICATIONS

This U.S. non-provisional application claims priority under 35 U.S.C. §119 to Korean Patent Application No. 2003-58274 filed Aug. 22, 2003, the contents of which are incorporated by reference.

BACKGROUND OF THE INVENTION

1. Field of the Invention

The present invention relates generally to electronic packaging technology and, more particularly, to semiconductor packages having improved chip-attaching structures and methods for manufacturing the semiconductor packages with improved chip-attaching reliability.

2. Description of the Related Art

In general, an electronic package or a semiconductor package is defined as the housing and interconnection of integrated circuits (also referred to as ‘semiconductor chips’, ‘chips’, or ‘die’) to form an electronic system. The functions which the package must provide include a structure to physically support the chip, a physical housing to protect the chip from the environment, an adequate means of removing heat generated by the chips or system, and electrical connections to allow signal and power access to and from the chip.

An example of a conventional semiconductor package is shown in FIG. 1. Referring to FIG. 1, the package 10 includes a semiconductor chip 11, a substrate 12, bonding wires 13, an adhesive layer 14, an encapsulating layer 15, and solder balls 17.

The chip 11 is disposed on an upper surface of the substrate 12, and the solder balls 17 are arranged on a lower surface of the substrate 12. The bonding wires 13 electrically connect chip pads 11*a* of the chip 11 and substrate pads 12*a* of the substrate 12. The adhesive layer 14 physically attaches and supports the chip 11 to the substrate 12. The encapsulating layer 15 protects the chip 11, the wires 13, and the upper surface of the substrate 12 from the environment.

The above-described conventional package 10 has drawbacks as follows.

First, adhesive material used for the adhesive layer 14 may often overflow beyond the boundary 11*b* of the chip 11. Unfortunately, an overflowing part 14*a* of the adhesive layer 14 tends to affect and contaminate the substrate pads 12*a*. This may result in poor bonding of the wires 13 on the substrate pads 12*a*.

Second, the chip 11 and the substrate 12 may warp due to a difference in the coefficient of thermal expansion (CTE) during a chip attaching process and may be restored after the chip attaching process. This often causes what is called an under-coverage problem where the aforementioned overflowing part 14*a* enters between the chip 11 and the substrate 12.

Third, when the encapsulating layer 15 is formed, unfavorable adhesive voids may form between the chip 11 and the substrate 12. In most cases, such adhesive voids are a prime cause of low attaching reliability.

SUMMARY OF THE INVENTION

A semiconductor package comprises a chip having a top surface for chip pads and a bottom surface opposite the top surface. The top and bottom surfaces define side surfaces. The package further includes an adhesive layer provided within a chip-attaching area substantially defined by side surfaces of the chip and attaches a chip to, for example, a substrate having substrate pads. This prevents the contamination of the substrate pads by the adhesive layer. In one embodiment, the adhesive layer has at least one hole formed therethrough to expose a portion of the bottom surface of the chip. The adhesive layer may include at least one passage laterally connecting the hole to the outside. Alternatively, the adhesive layer has a plurality of adhesive parts separately disposed on the semiconductor chip.

According to another embodiment of the present invention, a method for manufacturing a semiconductor package comprises providing a substrate having a plurality of substrate pads; providing a semiconductor chip having a top surface on which a plurality of chip pads are formed, the chip having a bottom surface opposite the top surface, the top and bottom surfaces defining side surfaces; providing an adhesive layer on the substrate within a chip-attaching area substantially defined by the side surfaces of the chip, the adhesive layer having at least one hole formed therein to expose a portion of the bottom surface; and placing the chip onto the adhesive layer and attaching the chip to the substrate through the adhesive layer

DETAILED DESCRIPTION OF THE INVENTION

The present invention will now be described more fully hereinafter with reference to the accompanying drawings, in which several preferred embodiments of the invention are shown. This invention may, however, be embodied in many different forms and is not limited to the embodiments presented in this disclosure. Rather, these embodiments are provided so that this disclosure will be thorough and complete, and will fully convey the scope of the invention to those skilled in the art.

In the description, well-known structures and processes have not been shown in detail to avoid obscuring the present invention. It will be appreciated that for simplicity and clarity of illustration, some elements illustrated in the figures have not necessarily been drawn to scale. For example, the dimensions of some of the elements are exaggerated relative to other elements for clarity. Like numerals are used for like and corresponding parts of the various drawings.

Figure 1:
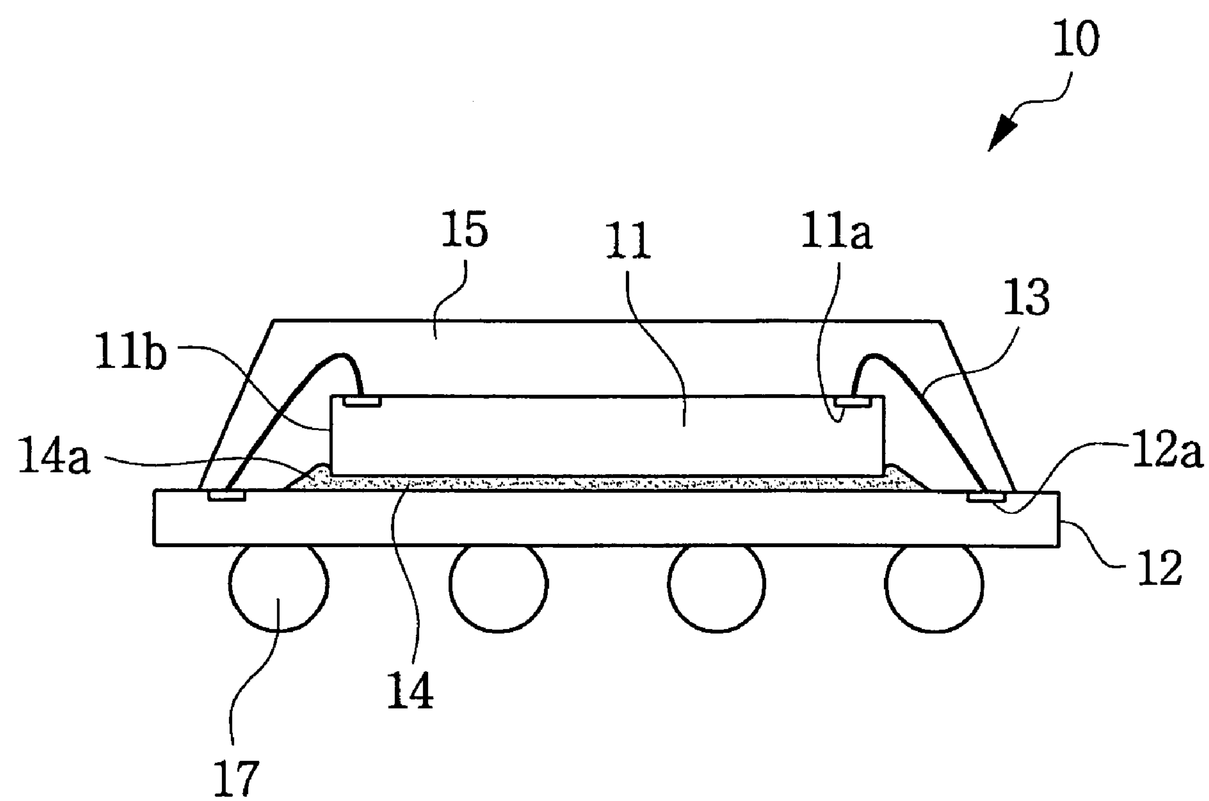
FIG. 1 is a cross-sectional view schematically showing a conventional semiconductor package.
Figure 2:
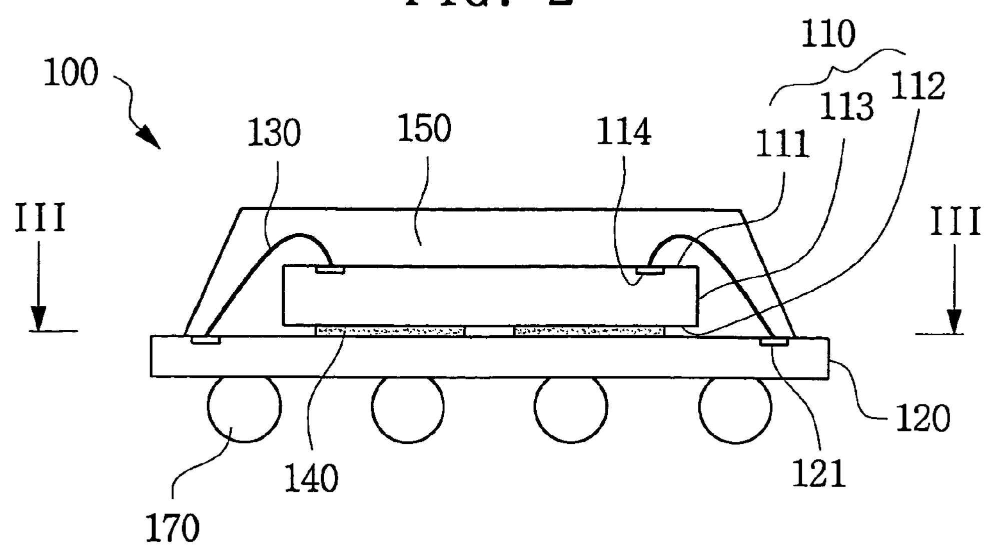
FIG. 2 is a cross-sectional view schematically showing a semiconductor package in accordance with an embodiment of the present invention.

FIG. 2 schematically shows, in a cross-sectional view, a semiconductor package 100 in accordance with a first embodiment of the present invention. As shown in FIG. 2, the package 100 includes a semiconductor chip 110, a substrate 120, a plurality of bonding wires 130, an adhesive layer 140, an encapsulating layer 150, and a plurality of solder balls 170.

The chip 110 is disposed on an upper surface of the substrate 120, and the solder balls 170 are arranged on a lower surface of the substrate 120. The bonding wires 13 electrically connect chip pads 114 of the chip 110 and substrate pads 121 of the substrate 120. The adhesive layer 140 physically attaches and supports the chip 110 to the substrate 120. The encapsulating layer 150 protects the chip 110, the wires 130, and the upper surface of the substrate 120 from the environment.

The chip 110 may have a top surface 111, sometimes referred to as an active surface, on which the chip pads 114 are formed. The chip 110 further has a bottom surface 112 facing the substrate 120 and a side surface 113 connecting the top surface 111 and the bottom surface 112.

Figure 3A:
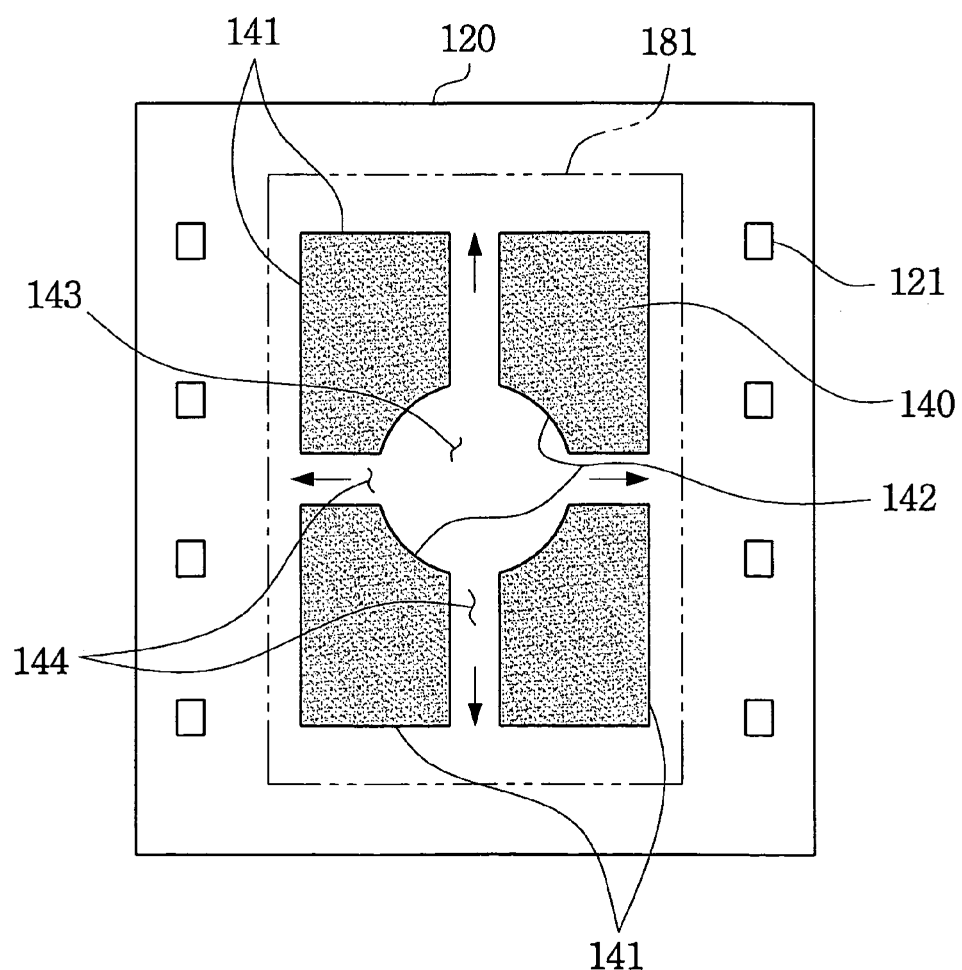
FIG. 3A is a cross-sectional view taken along the line III—III of FIG. 2.

FIG. 3A is a cross-sectional view taken along the line III—III of FIG. 2. As shown in the embodiment in FIG. 3A, the adhesive layer 140 is provided on the substrate 120 within a chip-attaching area 181, which is substantially defined by the side surface 113 of the chip 110. By restricting the adhesive layer 140 to substantially within the chip-attaching area 181, the contamination of the substrate pads 121 by the adhesive layer 140 is prevented.

The adhesive layer 140 may have an outer periphery 141 and a hole 143 surrounded with an inner periphery 142. Thus, the hole 143 of the adhesive layer 140 can expose a corresponding portion of the substrate 120 or of the semiconductor chip 110. In one embodiment the hole extends through the adhesive layer before attaching the semiconductor chip 110 to another object such as a substrate or other chip. The adhesive layer 140 further may have at least one passage 144 laterally connecting the hole 143 to the outside of the adhesive layer 140.

Figure 3B:
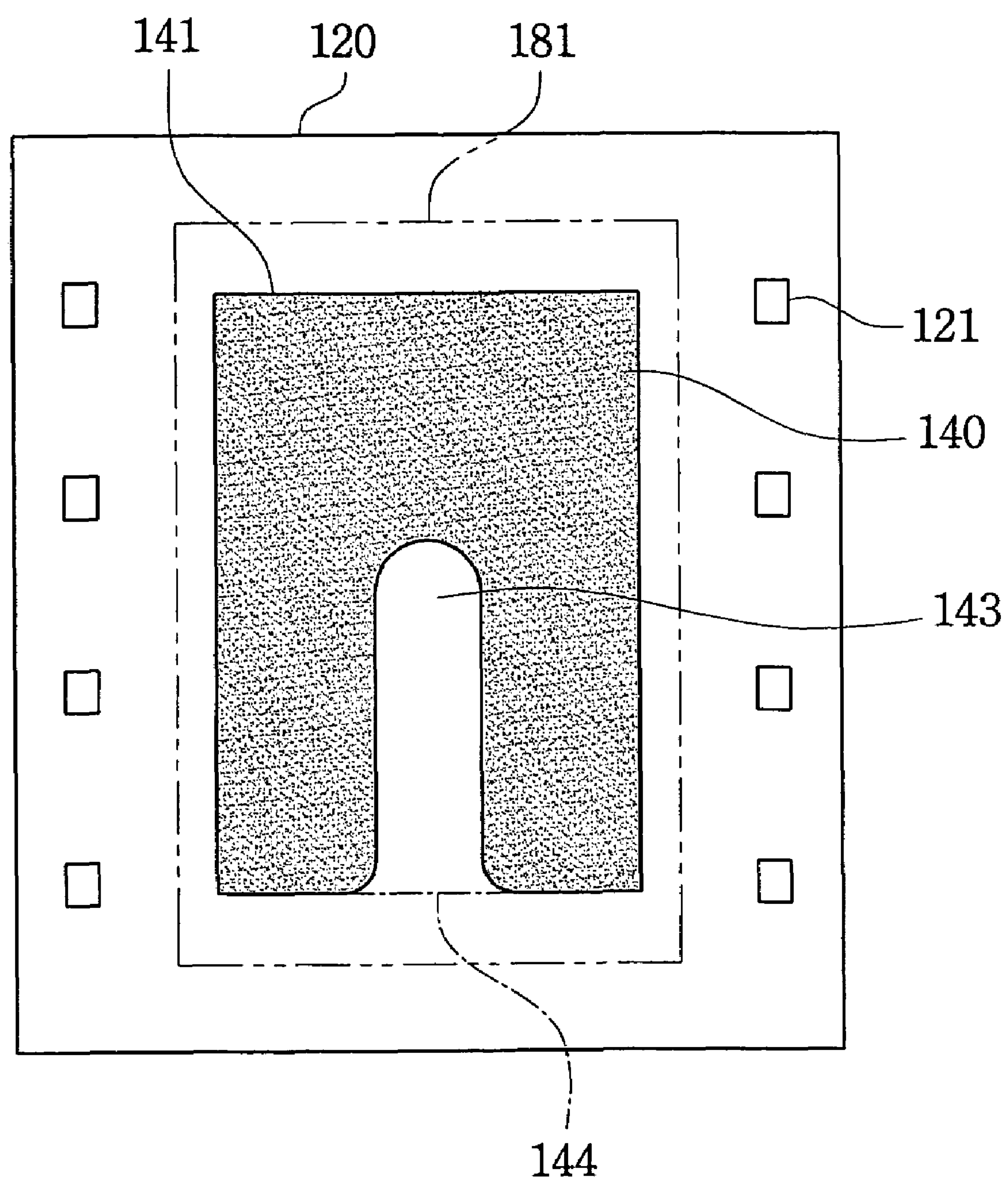
FIG. 3B is another cross-sectional view taken along the line III—III of FIG. 2.

The hole 143 serves to gather some of the aforementioned adhesive voids, such as those produced between the chip 110 and the substrate 120 when the encapsulating layer 150 is formed. The passage 144 provides a path that permits the adhesive voids to be exhausted outward, most likely in directions indicated by arrows in the drawing, under vacuum atmosphere, as mentioned above. This embodiment employs one hole 143 and four passages 144, however the number of them or a shape thereof is not necessarily limited to this embodiment. FIG. 3B shows one of alternatives to this embodiment.

Referring to FIG. 3B, the hole 143 communicates with the outside of the adhesive layer 140 at one side of the outer periphery 141. The passage 144 is not particularly distinguished from the hole 143 by shapes or numbers.

Figure 4:
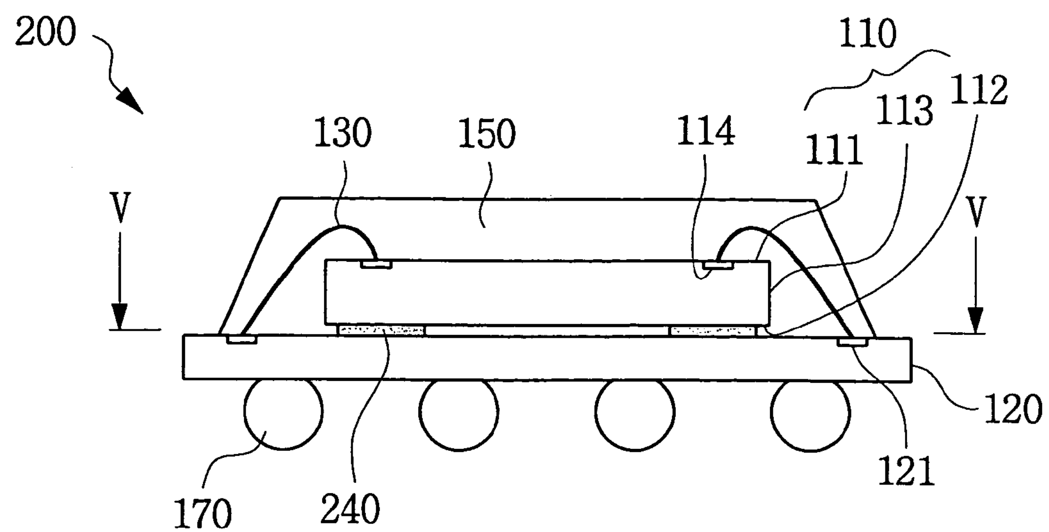
FIG. 4 is a cross-sectional view schematically showing a semiconductor package in accordance with another embodiment of the present invention.
Figure 5:
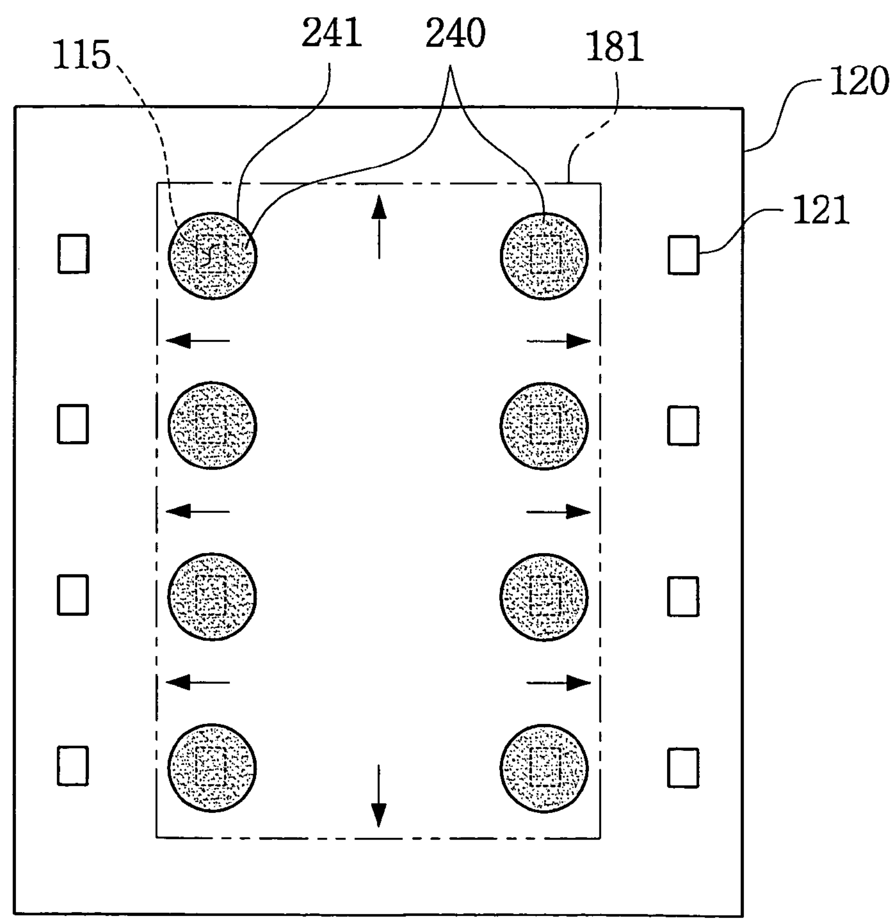
FIG. 5 is a cross-sectional view taken along the line V—V of FIG. 4.

FIG. 4 schematically shows, in a cross-sectional view, a semiconductor package 200 in accordance with another embodiment of the present invention. FIG. 5 is a cross-sectional view taken along the line V—V of FIG. 4. Referring to FIGS. 4 and 5, embodiments of the package 200 may include a plurality of disk-like adhesive parts 240, which act as an adhesive layer between the chip 110 and the substrate 120. Preferably, the number of the disk-like adhesive parts 240 is the same as that of the chip pads 114. A dotting or writing method forms the disk-like adhesive parts 240.

The disk-like adhesive parts 240 may occupy the same relative positions as the respective chip pads 114 do. For comparison, FIG. 5 shows a plurality of imaginary pads 115, which are images of the chip pads 114 projected on the substrate 120. As seen from the embodiment in FIG. 5, the imaginary pads 115 corresponding to the chip pads 114, are embraced by peripheries 241 of the respective disk-like adhesive parts 240. This assists a reliable wire bonding process. That is, when a bonding capillary (not shown) presses down a wire ball on the chip pad 114 to bond the wire 130 to the chip 110, the disk-like adhesive part 240 can absorb the bonding force of the capillary. Moreover, since the disk-like adhesive parts 240 are separately disposed between the chip 110 and the substrate 120, the above-discussed adhesive voids can be exhausted outward through spaces between the adjacent disk-like adhesive parts 240.

Figure 6:
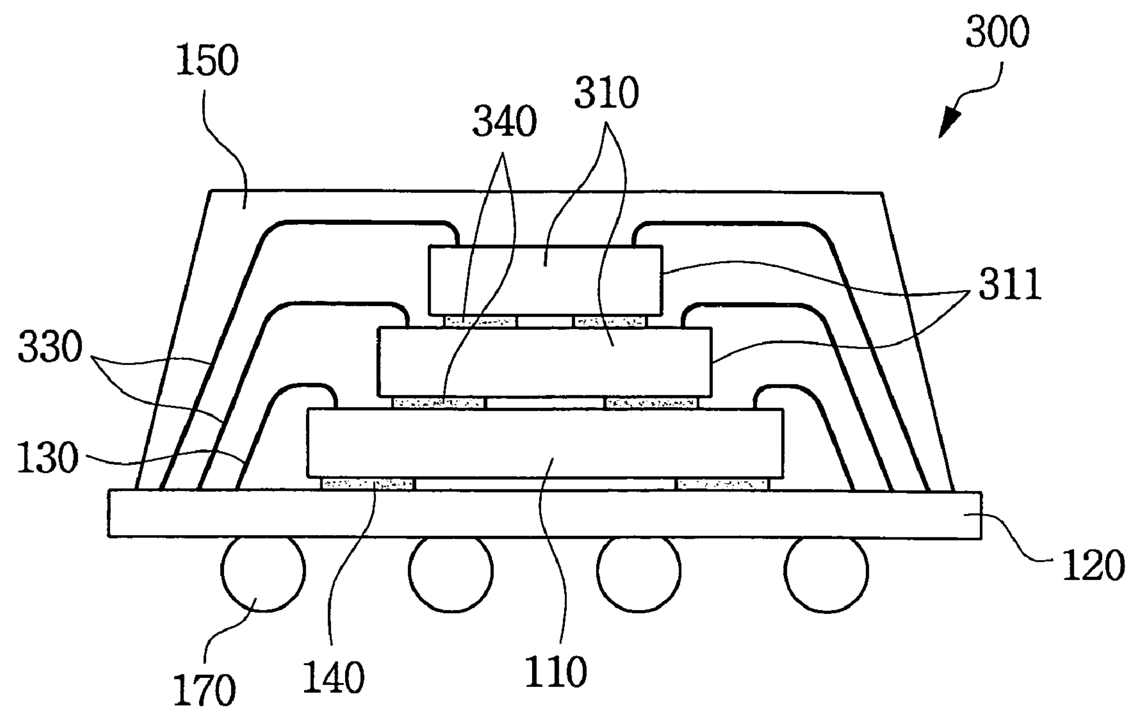
FIG. 6 is a cross-sectional view schematically showing a semiconductor package in accordance with still another embodiment of the present invention.

The present invention can be also effectively applied to other package structures, for example, three-dimensional chip stack embodiments, which are shown in FIG. 6.

Referring to the embodiment in FIG. 6, a semiconductor package 300 has a chip stack configuration. In this configuration, one or more chips 310 are stacked on the lowermost chip 110 directly attached to the substrate 120. Like chip-to-substrate connection as described above, chip-to-chip connection may be established by adhesive layers 340 with bonding wires 330 additionally used.

Specifically, the additional adhesive layer 340 may physically attach a relatively upper chip to a relatively lower chip. The adhesive layer 340 may then be provided on the lower chip within a chip-attaching area defined by a side surface 311 of the upper chip. The adhesive layer 340 has at least one hole and at least one passage for the exhaust of the adhesive voids. Preferably, the adhesive layer 340 is composed of a plurality of disk-like adhesive parts. Further, the additional bonding wires 330 electrically connect the stacked chips 310 to the substrate 120.

FIG. 7A to FIG. 7F successively show, in cross-sectional views, a process of manufacturing a semiconductor package in accordance with an embodiment of the present invention.

Figure 7A:
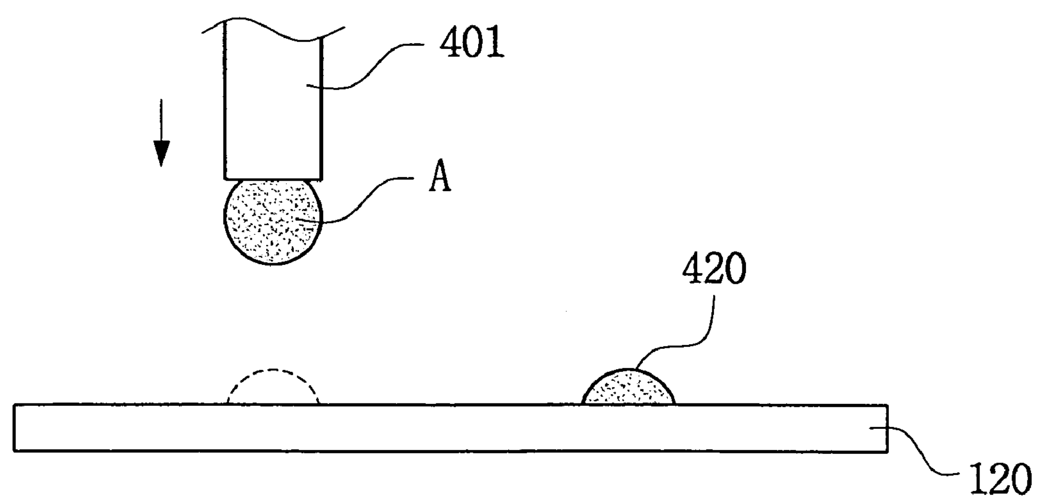
FIG. 7A to FIG. 7F are cross-sectional views successively showing a process of manufacturing a semiconductor package in accordance with still another embodiment of the present invention.

As shown in FIG. 7A, an adhesive material, indicated by a letter 'A' in the drawing, is supplied onto the substrate 120 by using a dotting tool 401 or other tools that can apply the adhesive. The adhesive material on the substrate 120 may form hemispheric drops 420. For a more reliable wire bond in a subsequent wire bonding process, the hemispheric drops 420 are formed on given positions corresponding to the chip pads (114 in FIG. 4).

Figure 7B:
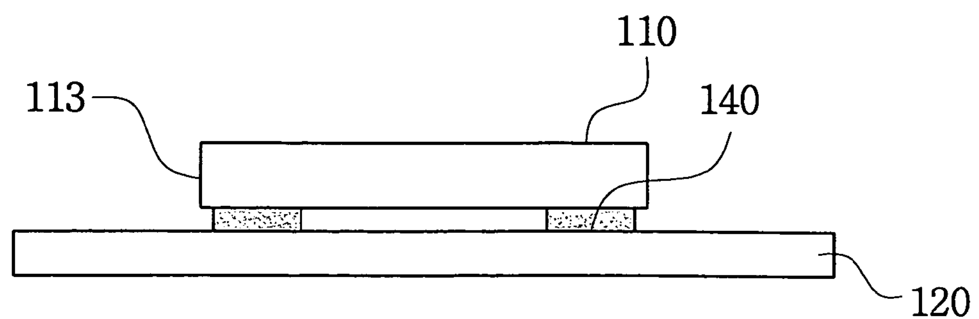

Next, as shown in FIG. 7B, the chip 110 is placed onto the hemispheric drops 420 of the adhesive material. By curing, the hemispheric drops 420 form the adhesive layer 140 and thereby physically attaching the chip 110 to the substrate 120.

Figure 7C:
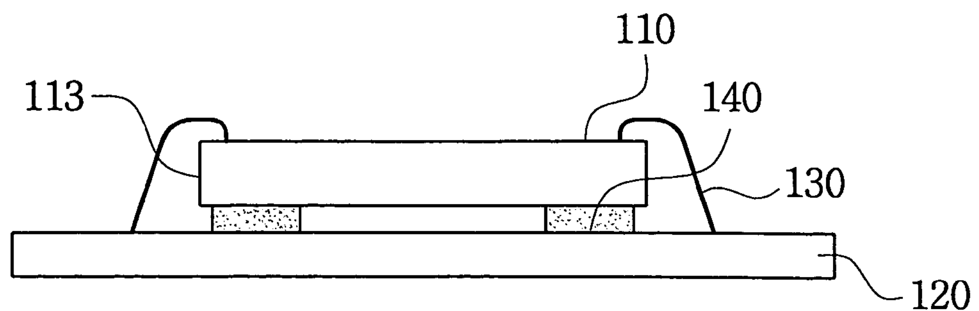

Next, as shown in FIG. 7C, a wire bonding process is carried out. For electrical connection between the chip 110 and the substrate 120, each bonding wire 130 is bonded to the chip 110 at one end and to the substrate 120 at the other end.

Figure 7D:
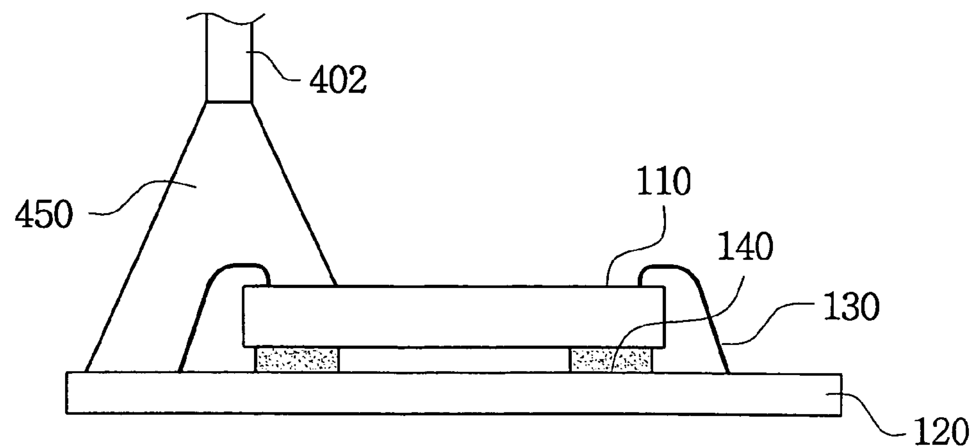

Next, as shown in FIG. 7D, a sealing material 450 is supplied toward the bonding wires 130 by using a dispensing tool 402 or other alternative tools. The sealing material 450 covers the bonding wires 130, together with wire-bonded areas on the chip 110 and the substrate 120, so that the wire bonds are more strengthened.

Figure 7E:
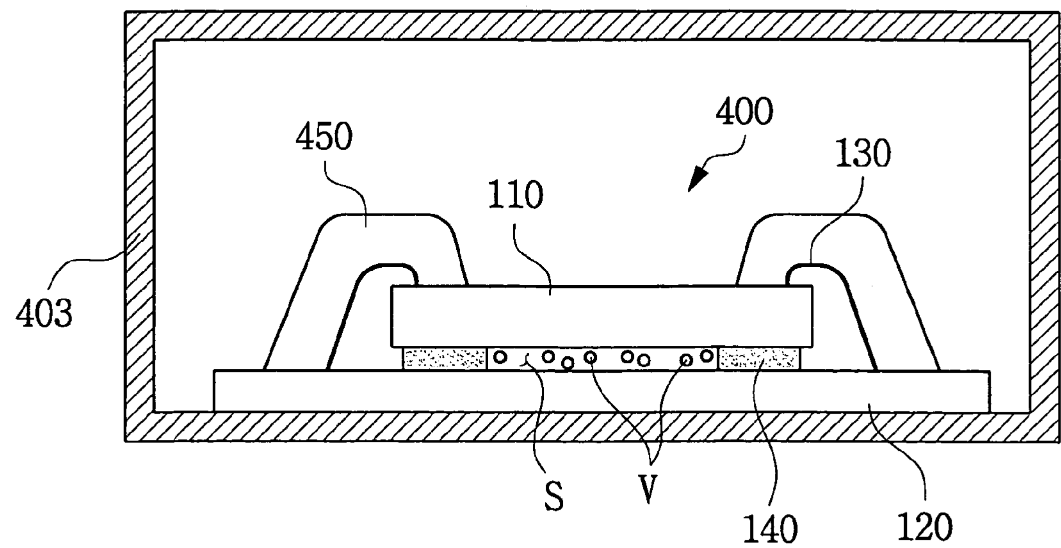

Next, as shown in FIG. 7E, a resultant structure 400 is supplied into a vacuum chamber 403. By vacuum atmosphere in the vacuum chamber 403, the adhesive voids, indicated by a letter 'V', are exhausted through the passage, indicated by a letter 'S', produced in adhesive layer 140. Empty spaces from which the adhesive voids are removed may fill with sealing material 450. Therefore, the sealing material 450 also enhances tightness between the chip 110 and the substrate 120. The sealing material 450 is cured after exhaust of adhesive voids.

Figure 7F:
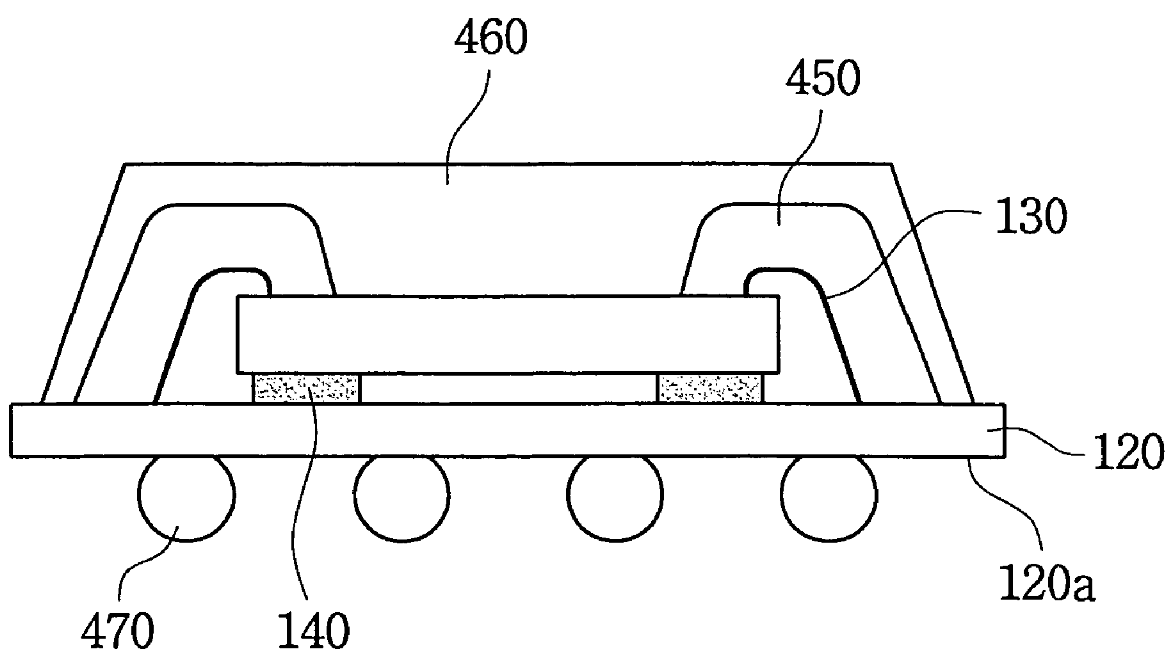

Next, as shown in FIG. 7F, a molding process may be carried out to form a molded body 460. The molded body 460, chiefly made of resin such as epoxy molding compound (EMC), substantially encapsulates the elements disposed above the substrate 120. In the past, the bonding wires 130 have often been swept due to a flow of molding resin during the molding process. The sealing material 450 prevents the sweep of the bonding wires 130. If the sealing material 450 is used for the package 400, the formation of the molded body 460 is optional.

Finally, a plurality of solder balls 470 may be formed on the lower surface 120*a* of the substrate 120 to provide electrical connections between the package 400 and an external electronics.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor package comprising:

a semiconductor chip having a top surface for chip pads and a bottom surface opposite the top surface, the top and bottom surfaces defining side surfaces;

an adhesive layer having at least one hole formed therethrough to expose a portion of the bottom surface, the adhesive layer attached to the bottom surface of the semiconductor chip; and a substrate having a plurality of substrate pads, the substrate attached directly to the semiconductor chip by the adhesive layer;

wherein the adhesive layer has at least one passage laterally connecting the hole to the outside.

2. The semiconductor package of claim 1, wherein the at least one hole is shaped to reduce any voids created in the adhesive layer during attachment of the semiconductor chip to any object.

3. The semiconductor package of claim 1, further comprising electrical connections to connect the chip pads with the substrate pads.

4. The semiconductor package of claim 3, wherein the adhesive layer remains within a chip-attaching area substantially defined by the side surfaces of the semiconductor chip.

5. The semiconductor package of claim 1, wherein the adhesive layer has a plurality of adhesive parts separately disposed on the semiconductor chip.

6. The semiconductor package of claim 1, further comprising one or more semiconductor chips stacked on the semiconductor chip.

7. The semiconductor package of claim 6, further comprising an additional adhesive layer attaching a relatively upper chip to a relatively lower chip.

8. The semiconductor package of claim 3, further comprising an encapsulating layer encapsulating the chip and the electrical connections.

9. The semiconductor package of claim 8, wherein the encapsulating layer includes a sealing material covering the electrical connections.

10. The semiconductor package of claim 8, wherein the encapsulating layer includes a molded body.

11. The semiconductor package of claim 1, wherein the substrate has a substantially continuous chip-attaching area corresponding to the hole of the adhesive layer.

12. A semiconductor package comprising:

a semiconductor chip having a top surface for chip pads and a bottom surface opposite the top surface, the top and bottom surfaces defining side surfaces; and an adhesive layer having at least one hole formed therethrough to expose a portion of the bottom surface, the adhesive layer attached to the bottom surface of the semiconductor chip;

wherein the adhesive layer has a plurality of adhesive parts separately disposed on the semiconductor chip; and wherein some of the plurality of adhesive parts are placed corresponding to the chip pads.

13. A method for manufacturing a semiconductor package, the method comprising:

providing a substrate having a plurality of substrate pads;

providing a semiconductor chip having a top surface on which a plurality of chip pads are formed, the chip having a bottom surface opposite the top surface, the top and bottom surfaces defining side surfaces;

providing an adhesive layer on the substrate within a chip-attaching area substantially defined by the side surfaces of the chip, the adhesive layer having at least one hole formed therein to expose a portion of the bottom surface;

placing the bottom surface of the chip onto the adhesive layer and attaching the chip directly to the substrate through the adhesive layer; and forming at least one passage laterally connecting the hole to the outside.

14. The method of claim 13, further comprising electrically connecting the chip pads of the chip to the substrate pads of the substrate, respectively.

15. The method of claim 14, further comprising providing a sealing material to protect electrical connections between the chip pads and the substrate pads.

16. The method of claim 13, further comprising exhausting voids through the passage in the adhesive layer.

17. The method of claim 13, further comprising forming a molded body to encapsulate the chip on the substrate.

18. The method of claim 13, further comprising stacking one or more additional semiconductor chips on the semiconductor chip disposed on the substrate.

19. A method for manufacturing a semiconductor package, the method comprising:

providing a substrate having a plurality of substrate pads;

providing a semiconductor chip having a top surface on which a plurality of chip pads are formed, the chip having a bottom surface opposite the top surface, the top and bottom surfaces defining side surfaces;

providing an adhesive layer on the substrate within a chip-attaching area substantially defined by the side surfaces of the chip, the adhesive layer having at least one hole formed therein to expose a portion of the bottom surface; and exhausting voids through the passage in the adhesive layer;

wherein the exhaust of the voids is carried out by vacuum in a vacuum apparatus.

20. A method for manufacturing a semiconductor package, the method comprising:

providing a substrate having a plurality of substrate pads;

providing a semiconductor chip having a top surface on which a plurality of chip pads are formed, the chip having a bottom surface opposite the top surface, the top and bottom surfaces defining side surfaces; and providing an adhesive layer on the substrate within a chip-attaching area substantially defined by the side surfaces of the chip, the adhesive layer having at least one hole formed therein to expose a portion of the bottom surface;

wherein providing the adhesive layer comprises using a dotting or writing method.

21. A semiconductor package, comprising:

a semiconductor chip having a top surface for chip pads and a bottom surface opposite the top surface, the top and bottom surfaces defining side surfaces;

an adhesive layer attached to the bottom surface of the semiconductor chip, wherein the adhesive layer has a plurality of adhesive parts separately disposed on the semiconductor chip; and a substrate having a plurality of substrate pads, the substrate attached directly to the semiconductor chip by the adhesive layer;

wherein the adhesive parts are arranged to form at least one passage laterally connecting an exposed portion of the of the substrate or the semiconductor chip to the outside.

22. A semiconductor package, comprising:

a semiconductor chip having a top surface for chip pads and a bottom surface opposite the top surface, the top and bottom surfaces defining side surfaces;

an adhesive layer attached to the bottom surface of the semiconductor chip, wherein the adhesive layer has a plurality of adhesive parts separately disposed on the semiconductor chip; and a substrate having a plurality of substrate pads, the substrate attached to the semiconductor chip by the adhesive layer;

wherein some of the plurality of adhesive parts are placed corresponding to the location of the chip pads.

23. A method for manufacturing a semiconductor package, the method comprising:

providing a substrate having a plurality of substrate pads;

providing a semiconductor chip having a top surface on which a plurality of chip pads are formed, the chip having a bottom surface opposite the top surface, the top and bottom surfaces defining side surfaces;

providing an adhesive layer on the substrate within a chip-attaching area substantially defined by the side surfaces of the chip, wherein the adhesive layer has a plurality of adhesive parts separately disposed on the semiconductor chip; and placing the bottom surface of the chip onto the adhesive layer and attaching the chip directly to the substrate through the adhesive layer wherein the adhesive parts are arranged to form at least one passage laterally connecting an exposed portion of the of the substrate or the semiconductor chip to the outside.

24. A semiconductor package, comprising:

a semiconductor chip having a top surface for chip pads and a bottom surface opposite the top surface, the top and bottom surfaces defining side surfaces;

an adhesive layer attached to the bottom surface of the semiconductor chip, wherein the adhesive layer has a plurality of adhesive parts separately disposed on the semiconductor chip; and a substrate having a plurality of substrate pads the substrate attached to the semiconductor chip by the adhesive layer;

wherein providing the adhesive layer comprises using a dotting method.

25. The method of claim 24, wherein the adhesive layer forms a hemispheric drop.

* * * * *